(12) United States Patent
Heikman et al.

(10) Patent No.: US 9,461,201 B2
(45) Date of Patent: Oct. 4, 2016

(54) LIGHT EMITTING DIODE DIELECTRIC MIRROR

(71) Applicant: CREE, INC., Durham, NC (US)

(72) Inventors: Sten Heikman, Goleta, CA (US); James Ibbetson, Santa Barbara, CA (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 13/909,927

(22) Filed: Jun. 4, 2013

(65) Prior Publication Data

US 2013/0341634 A1 Dec. 26, 2013

Related U.S. Application Data

(63) Continuation-in-part of application No. 13/071,349, filed on Mar. 24, 2011, now Pat. No. 8,598,609, which is a continuation of application No. 12/316,097, filed on Dec. 8, 2008, now Pat. No. 7,915,629, application (Continued)

(51) Int. Cl.
*H01L 33/00* (2010.01)
*H01L 33/10* (2010.01)

(Continued)

(52) U.S. Cl.
CPC .............. *H01L 33/10* (2013.01); *H01L 33/32* (2013.01); *H01L 33/46* (2013.01); *H01L 33/38* (2013.01); *H01L 33/405* (2013.01)

(58) Field of Classification Search
CPC ....... H01L 33/46; H01L 33/32; H01L 33/10; H01L 33/38; H01L 33/405
USPC .............................. 257/76, 79, 98
See application file for complete search history.

(56) References Cited

U.S. PATENT DOCUMENTS 1,393,573 A    10/1921 Ritter ........................... 362/509
1,880,399 A    10/1932 Benjamin
(Continued)

FOREIGN PATENT DOCUMENTS

CN    1841183 A    10/2006
CN    1957481       5/2007
(Continued)

OTHER PUBLICATIONS

International Search Report and Written Opinion from PCT Application No. PCT/US2013/028684, dated May 28, 2013.
(Continued)

*Primary Examiner* — Nikolay Yushin
(74) *Attorney, Agent, or Firm* — Koppel, Patrick, Heybl & Philpott

(57) ABSTRACT

A high efficiency LED chip is disclosed that comprises an active LED structure comprising an active layer between two oppositely doped layers. A first reflective layer can be provided adjacent to one of the oppositely doped layers, with the first layer comprising a material with a different index of refraction than the active LED structure. The difference in IR between the active LED structure and the first reflective layer increases TIR of light at the junction. In some embodiments the first reflective layer can comprise an IR lower than the semiconductor material, increasing the amount of light that can experience TIR. Some embodiments of LED chips according to the present invention can also comprise a second reflective layer or metal layer on and used in conjunction with the first reflective layer such that light passing through the first reflective layer can be reflected by the second reflective layer.

40 Claims, 4 Drawing Sheets

Related U.S. Application Data

No. 13/909,927, which is a continuation of application No. 12/463,709, filed on May 11, 2009, now Pat. No. 8,368,100, which is a continuation-in-part of application No. 11/985,410, filed on Nov. 14, 2007, and a continuation-in-part of application No. 12/329,713, filed on Dec. 8, 2008, now Pat. No. 8,575,633.

(51) Int. Cl.
 *H01L 33/32* (2010.01)
 *H01L 33/46* (2010.01)
 *H01L 33/38* (2010.01)
 *H01L 33/40* (2010.01)

(56) References Cited

U.S. PATENT DOCUMENTS

| | | | |
|---|---|---|---|
| 2,214,600 A | 9/1940 | Winkler | 362/279 |
| 2,981,827 A | 4/1961 | Orsatta | 362/84 |
| 2,981,927 A | 4/1961 | Orsatti et al. | |
| 3,395,272 A | 7/1968 | Nicholl | 362/305 |
| 4,420,800 A | 12/1983 | Van Horn | 362/297 |
| 4,946,547 A | 8/1990 | Palmour et al. | 156/643 |
| 5,018,157 A | 5/1991 | Deppe et al. | 372/45.013 |
| 5,200,022 A | 4/1993 | Kong et al. | 156/612 |
| RE34,861 E | 2/1995 | Davis et al. | 437/100 |
| 5,768,339 A | 6/1998 | O'Hara | 378/147 |
| 5,912,915 A | 6/1999 | Reed et al. | 372/93 |
| 6,055,261 A | 4/2000 | Reed et al. | |
| 6,076,948 A | 6/2000 | Bukosky et al. | 362/494 |
| 6,111,276 A | 8/2000 | Mauk | 257/98 |
| 6,149,283 A | 11/2000 | Conway et al. | |
| 6,409,361 B1 | 6/2002 | Ikeda | 362/240 |
| 6,454,439 B1 | 9/2002 | Camarota | |
| 6,459,713 B2 | 10/2002 | Jewell | 372/46 |
| 6,558,032 B2 | 5/2003 | Kondo et al. | 362/516 |
| 6,585,397 B1 | 7/2003 | Ebiko | |
| 6,603,151 B2 | 8/2003 | Lin et al. | 257/98 |
| 6,657,236 B1 | 12/2003 | Thibeault et al. | 257/98 |
| 6,720,583 B2 | 4/2004 | Nunoue et al. | 257/98 |
| 6,740,906 B2* | 5/2004 | Slater et al. | 257/99 |
| 6,758,582 B1 | 7/2004 | Hsiao et al. | |
| 6,784,462 B2 | 8/2004 | Schubert | |
| 6,793,373 B2 | 9/2004 | Matsuba et al. | 362/260 |
| 6,797,987 B2 | 9/2004 | Chen | 257/98 |
| 6,812,500 B2 | 11/2004 | Reeh et al. | |
| 6,812,502 B1 | 11/2004 | Chien et al. | 257/99 |
| 6,817,737 B2 | 11/2004 | Romano et al. | 362/293 |
| 6,840,652 B1 | 1/2005 | Hymer | 362/235 |
| 6,851,834 B2 | 2/2005 | Leysath | 362/303 |
| 6,986,594 B2 | 1/2006 | Wirth et al. | |
| 6,995,402 B2 | 2/2006 | Ludowise et al. | 257/91 |
| 7,055,991 B2 | 6/2006 | Lin | 362/311.02 |
| 7,121,690 B1 | 10/2006 | Ramer et al. | |
| 7,213,940 B1 | 5/2007 | Van De Ven et al. | 362/231 |
| 7,221,044 B2 | 5/2007 | Fan et al. | 257/676 |
| 7,256,483 B2 | 8/2007 | Epler et al. | |
| 7,275,841 B2 | 10/2007 | Kelly | 362/345 |
| 7,321,126 B2 | 1/2008 | Singer et al. | 250/492 |
| 7,326,967 B2 | 2/2008 | Hsieh et al. | |
| 7,332,365 B2 | 2/2008 | Nakamura et al. | |
| 7,339,965 B2 | 3/2008 | Ledentsov et al. | 372/45 |
| 7,573,074 B2* | 8/2009 | Shum et al. | 257/99 |
| 7,607,808 B2 | 10/2009 | Birman et al. | 362/489 |
| 7,622,746 B1* | 11/2009 | Lester et al. | 257/98 |
| 7,638,810 B2 | 12/2009 | Bour et al. | 257/98 |
| 7,722,220 B2 | 5/2010 | Van De Ven | 362/294 |
| 7,784,977 B2 | 8/2010 | Moolman et al. | 362/298 |
| 7,795,623 B2 | 9/2010 | Emerson et al. | 257/79 |
| 7,821,023 B2 | 10/2010 | Yuan et al. | 257/98 |
| 7,915,629 B2 | 3/2011 | Ibbetson et al. | 257/98 |
| 7,922,366 B2 | 4/2011 | Li | 362/304 |
| 8,118,451 B2 | 2/2012 | Householder et al. | 362/277 |
| 8,212,273 B2 | 7/2012 | McKenzie et al. | |
| 8,235,541 B2 | 8/2012 | Chen | 362/97 |
| 8,324,652 B1 | 12/2012 | Lester et al. | |
| 8,431,423 B2 | 4/2013 | Basin et al. | 438/26 |
| 8,492,785 B2 | 7/2013 | Hodota | 257/98 |
| 8,791,471 B2 | 7/2014 | Leung | 257/88 |
| 2003/0015721 A1* | 1/2003 | Slater et al. | 257/99 |
| 2003/0025212 A1 | 2/2003 | Bhat et al. | |
| 2003/0128733 A1 | 7/2003 | Tan et al. | 372/96 |
| 2003/0210550 A1 | 11/2003 | Matsuba et al. | |
| 2004/0085463 A1 | 5/2004 | Sharma | 348/231.99 |
| 2004/0155565 A1 | 8/2004 | Holder et al. | 313/113 |
| 2004/0217362 A1 | 11/2004 | Slater et al. | |
| 2005/0063061 A1 | 3/2005 | Grawert et al. | |
| 2005/0168994 A1 | 8/2005 | Jacobson et al. | 362/311 |
| 2005/0211993 A1 | 9/2005 | Sano et al. | 257/79 |
| 2005/0225222 A1 | 10/2005 | Mazzochette et al. | 313/46 |
| 2005/0242358 A1 | 11/2005 | Tu et al. | 257/98 |
| 2006/0039009 A1 | 2/2006 | Kiesel et al. | 356/519 |
| 2006/0049411 A1 | 3/2006 | Nakamura et al. | |
| 2006/0060874 A1 | 3/2006 | Edmond et al. | 257/98 |
| 2006/0076568 A1 | 4/2006 | Keller et al. | 257/98 |
| 2006/0157723 A1 | 7/2006 | Lambkin et al. | 257/98 |
| 2006/0163586 A1 | 7/2006 | Denbaars et al. | |
| 2006/0163589 A1 | 7/2006 | Fan et al. | 257/88 |
| 2006/0274805 A1 | 12/2006 | Song et al. | |
| 2006/0278885 A1 | 12/2006 | Tain et al. | |
| 2007/0057270 A1 | 3/2007 | Bour et al. | 257/99 |
| 2007/0139923 A1 | 6/2007 | Negley | |
| 2007/0145380 A1 | 6/2007 | Shum et al. | |
| 2007/0158668 A1 | 7/2007 | Tarsa et al. | 257/79 |
| 2007/0217193 A1 | 9/2007 | Lin | |
| 2007/0217200 A1 | 9/2007 | Yang et al. | 362/277 |
| 2008/0035949 A1* | 2/2008 | Fudeta et al. | 257/99 |
| 2008/0061304 A1 | 3/2008 | Huang et al. | |
| 2008/0123341 A1 | 5/2008 | Chiu | 362/294 |
| 2008/0144688 A1 | 6/2008 | Chua et al. | |
| 2008/0173884 A1 | 7/2008 | Chitnis et al. | 438/22 |
| 2008/0179611 A1 | 7/2008 | Chitnis et al. | 257/98 |
| 2008/0185609 A1 | 8/2008 | Kozawa et al. | 257/99 |
| 2008/0191233 A1 | 8/2008 | Yang et al. | |
| 2008/0265268 A1 | 10/2008 | Braune et al. | 257/98 |
| 2008/0272391 A1 | 11/2008 | Kapur et al. | |
| 2008/0310158 A1 | 12/2008 | Harbers et al. | 362/294 |
| 2009/0026478 A1* | 1/2009 | Yoon et al. | 257/98 |
| 2009/0029495 A1 | 1/2009 | Li et al. | 438/29 |
| 2009/0050908 A1 | 2/2009 | Yuan et al. | 257/88 |
| 2009/0103293 A1 | 4/2009 | Harbers et al. | 362/231 |
| 2009/0121241 A1 | 5/2009 | Keller et al. | 257/94 |
| 2009/0152583 A1 | 6/2009 | Chen et al. | 257/98 |
| 2009/0161356 A1 | 6/2009 | Negley et al. | 362/231 |
| 2009/0161367 A1 | 6/2009 | Vanden Eynden | 362/297 |
| 2009/0213591 A1 | 8/2009 | Katabe et al. | 362/236 |
| 2009/0231856 A1 | 9/2009 | Householder | |
| 2009/0283779 A1 | 11/2009 | Negley et al. | 257/88 |
| 2009/0283787 A1 | 11/2009 | Donofrio et al. | 257/98 |
| 2009/0323334 A1 | 12/2009 | Roberts et al. | 362/247 |
| 2010/0001299 A1 | 1/2010 | Chang et al. | 257/89 |
| 2010/0012962 A1 | 1/2010 | Hong et al. | |
| 2010/0029023 A1 | 2/2010 | Neff et al. | 438/15 |
| 2010/0033655 A1 | 2/2010 | Nakamoto | 349/81 |
| 2010/0038659 A1 | 2/2010 | Chen et al. | |
| 2010/0039822 A1 | 2/2010 | Bailey | 362/296.1 |
| 2010/0051995 A1 | 3/2010 | Katsuno et al. | |
| 2010/0059785 A1 | 3/2010 | Lin et al. | |
| 2010/0065881 A1 | 3/2010 | Kim | |
| 2010/0103678 A1 | 4/2010 | Van De Ven et al. | 362/294 |
| 2010/0117099 A1 | 5/2010 | Leung | 257/88 |
| 2010/0117111 A1 | 5/2010 | Illek et al. | 257/98 |
| 2010/0140635 A1 | 6/2010 | Ibbetson et al. | |
| 2010/0140636 A1 | 6/2010 | Donofrio et al. | 257/98 |
| 2010/0155746 A1 | 6/2010 | Ibbetson et al. | |
| 2010/0158437 A1 | 6/2010 | Decorby | 385/14 |
| 2010/0163887 A1 | 7/2010 | Kim | 257/76 |
| 2010/0163900 A1 | 7/2010 | Seo | 257/98 |
| 2010/0165633 A1 | 7/2010 | Moolman et al. | |
| 2010/0171094 A1* | 7/2010 | Lu et al. | 257/13 |
| 2010/0171135 A1 | 7/2010 | Engl et al. | |
| 2010/0252848 A1 | 10/2010 | Liang et al. | |
| 2010/0279437 A1 | 11/2010 | Neff et al. | 438/14 |
| 2010/0308354 A1 | 12/2010 | David et al. | 257/98 |

(56) References Cited

U.S. PATENT DOCUMENTS

| | | | |
|---|---|---|---|
| 2010/0327295 A1 | 12/2010 | Peng et al. | 257/88 |
| 2011/0001148 A1 | 1/2011 | Sun et al. | 257/88 |
| 2011/0001422 A1 | 1/2011 | Aanegola et al. | 313/501 |
| 2011/0025190 A1 | 2/2011 | Jagt | 313/499 |
| 2011/0044027 A1 | 2/2011 | Chen | 362/97 |
| 2011/0049546 A1 | 3/2011 | Heikman et al. | 257/98 |
| 2011/0075423 A1 | 3/2011 | Van De Ven | |
| 2011/0084294 A1 | 4/2011 | Yao | 257/93 |
| 2011/0182073 A1 | 7/2011 | Sanpei et al. | 362/294 |
| 2012/0025244 A1 | 2/2012 | Suh | 257/98 |
| 2012/0086026 A1 | 4/2012 | Engl et al. | |
| 2012/0280263 A1 | 11/2012 | Ibbetson et al. | |

FOREIGN PATENT DOCUMENTS

| | | |
|---|---|---|
| CN | 201007449 | 1/2008 |
| CN | 101449100 | 6/2009 |
| CN | 101460779 | 6/2009 |
| DE | 102004040277 | 2/2006 |
| DE | 102007003282 | 7/2008 |
| DE | 102008005497 | 7/2009 |
| DE | 102008035900 | 11/2009 |
| EP | 1750310 A2 | 2/2007 |
| EP | 2259345 A1 | 12/2010 |
| EP | 2369650 A2 | 9/2011 |
| JP | 06045649 | 2/1994 |
| JP | 06268252 | 9/1994 |
| JP | 2005197289 | 7/2005 |
| JP | 2010087282 | 4/2010 |
| TW | 595689 | 5/2003 |
| TW | 595689 | 6/2004 |
| TW | M281297 | 11/2005 |
| TW | 200805717 | 1/2008 |
| TW | 200834991 | 8/2008 |
| WO | WO 00/34709 A1 | 6/2000 |
| WO | WO 2005/066539 A1 | 7/2005 |
| WO | WO 2005/078338 A1 | 8/2005 |
| WO | WO 2005078338 | 8/2005 |
| WO | WO 2005117152 | 12/2005 |
| WO | WO 2006/092697 A1 | 9/2006 |
| WO | WO 2007121739 | 1/2007 |
| WO | WO 2007115040 | 10/2007 |
| WO | WO 2007/130536 A2 | 11/2007 |
| WO | WO 2008089324 A2 | 7/2008 |
| WO | WO 2008089324 A3 | 7/2008 |
| WO | WO 2008107654 | 9/2008 |
| WO | WO 2008149250 | 12/2008 |
| WO | WO 2009/056927 A1 | 5/2009 |
| WO | WO 2010/029475 A1 | 3/2010 |
| WO | WO 2010029475 | 3/2010 |
| WO | WO 2010151600 | 12/2010 |
| WO | WO 2011031098 A2 | 3/2011 |
| WO | WO 2011071100 A1 | 6/2011 |

OTHER PUBLICATIONS

Jong Kyu kim, at al., "GaInN Light-emitting Diodes with RuO2/SiO2/Ag Omni-directional Reflector", Applied Physics Letters, AIP, American Institute of Physics, Nelville, NY, US, vol. 84, No. 22, May 31, 2004, pp. 4508-4510, XP012061652.

Y.S. Zhao, et al., "Efficiency Enhancement of InGaN/GaN Light-Emitting Diodes with a Back-Surface distributed Bragg Reflector", Journal of Electronic Materials, vol. 32, No. 12, Dec. 1, 2003, pp. 1523-1526, XP055063308.

Xu Qing-tao, at al., "Enhancing Extraction Efficiency from GaN-based LED by Using an Omni-directional Reflector and Photonic Crystal", Optoelectronics Letters, vol. 5, No. 6, Nov. 1, 2009, pp. 405-408. XP055063309.

J.-Q Xi, at al., "Optical Thin-film Materials with Low Refractive Index for Broadband Elimination of Fresnel Reflection", Nature Photonics, Nature Publishing Group, UK, vol. 1, No. 3, Mar. 1, 2007, pp. 176-179, XP002590687.

International Search Report and Written Opinion for Application No. PCT/US2012/034564, dated Sep. 5, 2012.

International Preliminary Report on Patentability from Application No. PCT/US09/66938, dated Apr. 3, 2012.

"High-Performance GaN-Based Vertical-Injection Light-Emitting Diodes With TiO2-SiO2 Omnidirectional Reflector and n-GaN Roughness" by H. W. Huang, et al., IEEE Photonics Technology Letters, vol. 19, No. 8, Apr. 15, 2007, pp. 565-567.

DOM LED Downlighting, Lithonia Lighting: an Acuity Brands, Company, www.lithonia.com. ©.

Ecos, Lighting the Next Generation, gothan: a division of Acuity Brands Lighting Inc., © 2008.

Renaissance Lighting brochure, © 2010.

International Search Report and Written Opinion for PCT Application No. PCT/US2011/001394 mailed Nov. 3, 2011.

Cree EZ400 LED Data Sheet, 2007 Cree's EZBright LEDs.

Cree EZ700 LED Data Sheet, 2007 Cree's EZBright LEDs.

Cree EZ1000 LED Data Sheet, 2007 Cree's EZBright LEDs.

Cree EZBright290 LED Data Sheet, 2007 Cree's EZBright LEDs.

International Search Report and Written Opinion for counterpart Application No. PCT/US2009/066938 mailed Aug. 30, 2010.

High-Performance GaN-Based Vertical-Injection Light-Emitting Diodes with TiO2-SiO2 Omnidirectional Reflector and n-GaN Roughness, H.W. Huang, IEEE Photonics Technology Letters vol. 19 No. 8, Apr. 15, 2007.

C.H. Lin et al., "Enhancement of InGaN-GaN Indium-Tin-Oxide Flip-Chip Light-Emitting Diodes with TiO2-SiO2 Multilayer Stack Omnidirectional Reflector," IEEE Photonics Technology Letters. vol. 18, No. 19, Oct. 1, 2006, pp. 2050-2052.

Windisch at al. "Impact of Texture-Enhanced Transmission on High-Efficiency Surface-Textured Light-Emitting Diodes," Applied Physics Letters, vol. 79, No. 15, Oct. 2001, pp. 2315-2317.

Schnitzer et al. "30% External Quantum Efficiency From Surface Textured, Thin-Film Light- Emitting Diodes," Applied Physics Letters, Oct. 18, 1993, vol. 64, No. 16, pp. 2174-2176.

Windisch et al. "Light-Extraction Mechanisms in High-Efficiency Surface-Textured Light-Emitting Diodes," IEEE Journal on Selected Topics in Quantum Electronics, vol. 8, No. 2, Mar./Apr. 2002, pp. 248-255.

Streubel, et al. "High Brightness AlGaInP Light-Emitting Diodes," IEEE Journal on Selected Topics in Quantum Electronics, vol. 8, No. 2, Mar./Apr. 2002, pp. 321-332.

Office Action from U.S. Appl. No. 12/418,796, Dated: Jul. 20, 2011.

Office Action from U.S. Appl. No. 12/329,722, Dated: Oct. 27, 2010.

International Search Report and Written Opinion for PCT Application No. PCT/US2010/002827 mailed May 2, 2011 (1).

International Search Report and Written Opinion for PCT/US2011/001394 mailed Nov. 3, 2011.

Notice of Reasons for Rejection from Japanese Patent Appl. No. 2011-539526, dated Jun. 25. 2013.

First Office Action and Search Report from Chinese Patent Appl. No. 201080023107.8. dated Jul. 12, 2013.

Office Action from U.S. Appl. No. 12/855,500, dated May 31, 2013.

Response to OA from U.S. Appl. No. 12/855,500, filed Sep. 3, 2013.

Office Action from U.S. Appl. No. 13/071,349, dated May 28, 2013.

Response to OA from U.S. Appl. No. 13/071,349, filed Jul. 18, 2013.

Office Action from U.S. Appl. No. 13/071,349, dated Jan. 17, 2013.

Response to OA from U.S. Appl. No. 13/071,349, filed Apr. 10, 2013.

Office Action from U.S. Appl. No. 12/553,025, dated Jun. 19, 2013.

Huang at al. High-Performance GaN-Based Vertical-Injection Light-Emitting Diodes with TiO2-SiO2 ohnidirectional Reflector and n-GaN Roughness, IEEE Photonics Technology Letters, vol. 19, No. 8, Apr. 15, 2007, pp. 565-567.

Raoufi at al. Surface characterization and microstructure of ITO thin films at different annealing temperatures. Applied Surface Science 253 (2007). pp. 9085-9090.

Office Action from U.S. Appl. No. 13/168,689, dated Jun. 28, 2013.

Office Action from U.S. Appl. No. 12/606,377, dated Jul. 9, 2013.

Office Action from U.S. Appl. No. 12/418,796, dated Aug. 7, 2012.

(56) References Cited

OTHER PUBLICATIONS

Response to OA from U.S. Appl. No. 12/418,796, filed Nov. 7, 2012.
Office Action from U.S. Appl. No. 12/418,796, dated Feb. 22, 2012.
Response to OA from U.S. Appl. No. 12/418,796, filed Jun. 22, 2012.
Office Action from U.S. Appl. No. 13/415,626, dated Sep. 28, 2012.
Response to OA from U.S. Appl. No. 13/415,626, filed Jan. 23, 2013.
Office Action from U.S. Appl. No. 12/855,500, dated Oct. 1, 2012.
Response to OA from U.S. Appl. No. 12/855,500, filed Feb. 25, 2013.
Office Action from U.S. Appl. No. 12/606,377, dated Nov. 26, 2012.
Response to OA from U.S. Appl. No. 12/606,377, filed Feb. 22, 2013.
Office Action from U.S. Appl. No. 12/757,179, dated Dec. 31, 2012.
Response to OA from U.S. Appl. No. 12/757,179, filed Apr. 23, 2013.
Office Action from U.S. Appl. No. 13/415,626, dated Feb. 28, 2013.
Response to OA from U.S. Appl. No. 13/415,626, filed Apr. 17, 2013.
Decision of Patent Grant from Japanese Patent Appl. No. 2011-539526, dated Oct. 22, 2013.
Office Action from U.S. Appl. No. 12/855,500, dated Dec. 4, 2013.
First Office Action from Chinese Patent Appl. No. 201180047069.4, dated Dec. 18, 2013.
First Office Action from Japanese Patent Appl. No. 201180047069.4, dated: Dec. 18, 2013.
Search Report from Japanese Patent Appl. No. 201180047069.4, dated: Dec. 18, 2013.
Comments on the Written Opinion and Amendment of the Application from European Patent Appl. No. 12723543.0, dated Feb. 21, 2014.
Final Office Action from U.S. Appl. No. 12/553,025, dated Dec. 31, 2013.
Lin et al., "Enhancement of InGaN-GaN Indium-Tin-Oxide Flip-Chip Light-Emitting Diodes with TiO2-SiO2 Multilayer Stack Omnidirectional Reflector", IEEE Photonics Technology Letters, vol. 18, No. 19, Oct. 1, 2006.
Second OA from Chinese Patent Appl. No. 201080023107.8, dated Mar. 7, 2014.
Office Action from U.S. Appl. No. 12/757,179, dated Mar. 11, 2014.
Office Action from U.S. Appl. No. 13/909,927, dated Apr. 2, 2014.
Office Action from U.S. Appl. No. 12/606,277, dated Apr. 9, 2014.
First Office Action and Search Report from Chinese Patent Appl. No. 2009-801492053, dated Jun. 20, 2014.
Office Action from U.S. Appl. No. 12/757,179, dated Jul. 15, 2014.
First Office Action from Chinese Patent Application No. 2009-801492034, dated Jun. 24, 2014.
Examination Report from European Patent Appl. No. 10774320.5-1757, dated Sep. 5, 2014.
Second Office Action from Chinese Patent Appl. No. 2011800470694, dated Aug. 6, 2014.
International Preliminary Report on Patentability from Appl. No. PCT/US2013/028684, dated Sep. 18, 2014.
Second Office Action from Chinese Patent Appl. No. 2009801492034, dated Jan. 6, 2015.
Office Action and Search Report from Taiwanese Patent Appl. No. 10420278720, dated Mar. 9, 2015.
Office Action from U.S. Appl. No. 12/553,025, dated Jan. 13, 2015.
Sanchez at al. Ion and electron beam assisted growth of nanometric Simon structures for near field microscopy, Review of Scientific Instruments, vol. 73, #11, 2002, pp. 3901-3907.
Office Action from U.S. Appl. No 14/185,589, dated Feb. 19, 2015.
Office Action from U.S. Appl. No. 12/606,377, dated Mar. 2, 2015.
Office Action from U.S. Appl. No. 14/219,916, dated Mar. 6, 2015.
Su et al., "Nitride-Eased LED's with n-GaN Current Spreading Layers". 2005. IEEE Electron Devices Letters, vol. 26, No. 12, pp. 891-893; Dec. 2005.
European Examination Report from European Patent Appl. No. 10 725 524.2-1757, dated Nov. 3, 2014.
Search Report from Taiwanese Appl. No. 099121883, dated Oct. 2, 2014.
Huang, et al., "High-Performance GaN-Based Vertical-Injection Light-Emitting Diodes With TiO2-SiO2 Omnidriectional Reflector and n-GaN Roughness", IEEE Photonics Technology Letters, vol. 19, No. 8. Apr. 15, 2007.
International Search Report and Written Opinion from PCT/US2014/058896, dated Dec. 22, 2014.
Office Action from U.S. Appl. No. 13/028,946, dated Oct. 28, 2014.
Response to OA from U.S. Appl. No. 13/028,946, filed Dec. 15, 2014.
Office Action from U.S. Appl. No. 14/219,916, dated Oct. 29, 2014.
Third Office Action from Chinese Appl. No. 201080023107.8, dated Sep. 29, 2014.
Communication from European Appl. No. 13709035.3-1551, dated Oct. 15, 2014.
Office Action from U.S. Appl. No. 12/606,377, dated Sep. 3, 2014.
Response to OA from U.S. Appl. No. 12/606,377, filed Oct. 23, 2014.
Office Action from U.S. Appl. No. 13/370,696, dated Aug. 27, 2014.
Examiner's Report from European Patent Appl. No. 10 774 32D.5-1757, dated Feb. 10, 2015.
Office Action from Chinese Patent Appl. No. 200980149205.3, dated Mar. 11, 2015.
Rejection Decision Chinese Patent Appl. No. 201080023107.8, dated Mar. 19, 2015.
Office Action from Taiwanese Patent Appl. No. 099110005, dated Mar. 26, 2015.
Office Action from Taiwanese Patent Appl. No. 099110005, dated Mar. 23, 2015.
Third Office Action from Chinese Appl. No. 2011800470694, dated Apr. 29, 2015.
Office Action from U.S. Appl. No. 12/553,025, dated May 29, 2015.
Examination Report from European Appl. No. 10 725 524.2-1757, dated Jun. 19, 2015.
Third Office Action from Chinese Appl. No. 2011800470694, dated Apr. 29. 2015.
Third Office Action from Chinese Appl. No. 200980149203.4, dated Jul. 3. 2015.
Notice of Allowance from Taiwanese Patent Appl. No. 099110005, dated Jul. 20. 2015.
Office Action from U.S. Appl. No. 14/219,916, dated Jun. 17, 2015.
Margalit et al. "64° C. Continuous-Wave Operation of 1.5-um Vertical Cavity Laser", 1997, IEEE Journal of Selected Topics in Quantum Electronics, vol. 3, pp. 359-365.
Office Action from U.S. Appl. No 14/185,589, dated Jul. 28, 2015.
Office Action from U.S. Appl. No. 14/050,001, dated Jul. 30, 2015.
Office Action and Search Report from Taiwanese Patent Appl. No. 10421191660, dated Sep. 2. 2015.
Notice of Issuance from Chinese Patent Application No. 200980149205.3, dated Sep. 24, 2015.
Examination from European Patent Appl. No. 09836676.8, dated Oct. 26, 2015.
Office Action Summary from Korean Patent Appl. No. 10-2011-7015872, dated Nov. 6. 2015.
Office Action from Taiwanese Patent Appl. No. 099136758, dated Oct. 26. 2015.
Office Action from U.S. Appl. No. 12/606,377, dated Sep. 18, 2015.
Office Action from U.S. Appl. No. 12/553,025, dated Nov. 10, 2015.
Internation Search Report and Written Opinion from Appl. No. PCTUS2014/040757, dated Sep. 9, 2014.
Office Action from U.S. Appl. No. 14/699,302; Apr. 5, 2016.
Office Action for Korean Application No. 10-2011-7015872; Dated May 26, 2016.
Notice of Allowance for Application No. 099121883; Dated Jun. 2, 2016.
Office Action from U.S. Appl. No. 14/050,001; Jun. 23, 2016.
Office Action for U.S. Appl. No. 14/699,302; Dated Jul. 28, 2016.
Foreign Office Action for European Application No. 09836676.8; Jul. 21, 2016.

* cited by examiner

LIGHT EMITTING DIODE DIELECTRIC MIRROR

This application is a continuation-in-part of, and claims the benefit of, U.S. patent application Ser. No. 13/071,349, to Ibbetson, et al., filed on Mar. 24, 2011, which is a continuation of and claims the benefit of U.S. patent application Ser. No. 12/316,097, to Li, et al., filed on Dec. 8, 2008, both of which are incorporated herein by reference. This application is also a continuation-in-part of, and claims the benefit of, U.S. patent application Ser. No. 12/463,709, to Denofrio, et al., filed on May 11, 2009, which is also a continuation-in-part of U.S. patent application Ser. No. 11/985,410, to Keller, et al., filed on Nov. 14, 2007, and a continuation-in-part of U.S. patent application Ser. No. 12/329,713, to Denofrio, et al. filed on Dec. 8, 2008, all of which are incorporated herein by reference.

BACKGROUND OF THE INVENTION

1. Field of the Invention

This invention relates to light emitting diodes, and more particularly to light emitting diodes having high reflectivity mirrors.

2. Description of the Related Art

Light emitting diodes (LED or LEDs) are solid state devices that convert electric energy to light, and generally comprise one or more active layers of semiconductor material sandwiched between oppositely doped n-type and p-type layers. When a bias is applied across the doped layers, holes and electrons are injected into the active layer where they recombine to generate light. Light is emitted from the active layer and from all surfaces of the LED.

For typical LEDs it is desirable to operate at the highest light emission efficiency, and one way that emission efficiency can be measured is by the emission intensity in relation to the input power, or lumens per watt. One way to maximize emission efficiency is by maximizing extraction of light emitted by the active region or active structure of LEDs. For conventional LEDs with a single out-coupling surface, the external quantum efficiency can be limited by a number of factors, such as total internal reflection (TIR) of light from the LED's emission region. TIR can be caused by the large difference in the refractive index between the LED's semiconductor and surrounding ambient. Some LEDs have relatively low light extraction efficiencies because of the high index of refraction of the substrate compared to the index of refraction for the surrounding material, such as epoxy. This difference results in a small escape cone from which light rays from the active area can transmit from the substrate into the epoxy and ultimately escape from the LED package. Light that does not escape can be absorbed in the semiconductor material or at surfaces that reflect the light.

Different approaches have been developed to reduce TIR and improve overall light extraction, with one of the more popular being surface texturing. Surface texturing increases the light escape probability by providing a varying surface that allows photons multiple opportunities to find an escape cone. Light that does not find an escape cone can continue to experience TIR, and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. 30% *External Quantum Efficiency From Surface Textured, Thin Film Light Emitting Diodes*, Appl. Phys. Lett., Vol 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaNInP Light Emitting Diodes*, IEEE Journal on Selected Topics in Quantum Electronics, Vol. 8, No. March/April 2002]. U.S. Pat. No. 6,657,236, also assigned to Cree Inc., discloses structures formed on the semiconductor layers for enhancing light extraction in LEDs.

Another way to increase light extraction efficiency is to provide reflective surfaces that reflect light so that it contributes to useful emission from the LED chip or LED package. In a typical LED package 10 illustrated in FIG. 1, a single LED chip 12 is mounted on a reflective cup 13 by means of a solder bond or conductive epoxy. One or more wire bonds 11 can connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. At least some of light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected. Some light may be absorbed by the reflector cup due to the less than 100% reflectivity of practical reflector surfaces. Some metals can have less than 95% reflectivity in the wavelength range of interest.

FIG. 2 shows another LED package in which one or more LED chips 22 can be mounted onto a carrier such as a printed circuit board (PCB) carrier, substrate or submount 23. A metal reflector 24 mounted on the submount surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond. The metal reflector 24 may also experience optical losses when the light is reflected because it also has less than 100% reflectivity.

The reflectors shown in FIGS. 1 and 2 are arranged to reflect light that escapes from the LED. LEDs have also been developed having internal reflective surfaces or layers to reflect light internal to the LEDs. FIG. 3 shows a schematic of an LED chip 30 with an LED 32 mounted on a submount 34 by a metal bond layer 36. The LED further comprises a p-contact/reflector 38 between the LED 32 and the metal bond 36, with the reflector 38 typically comprising a metal such as silver (Ag). This arrangement is utilized in commercially available LEDs such as those from Cree® Inc., available under the EZBright™ family of LEDs. The reflector 38 can reflect light emitted from the LED chip's active region toward the submount back toward the LED's primary emitting surface. The reflector also reflects TIR light back toward the LED's primary emitting surface. Like the metal reflectors above, reflector 38 reflects less than 100% of light and in some cases less than 95%. The reflectivity of a metal film on a semiconductor layer may be calculated from the materials' optical constants using thin film design software such as TFCalc™ from Software Spectra, Inc. (www.sspectra.com).

FIG. 4 shows a graph 40 showing the reflectivity of Ag on gallium nitride (GaN) at different viewing angles for light with a wavelength of 460 nm. The refractive index of GaN is 2.47, while the complex refractive index for silver is taken from the technical literature. [See *Handbook of Optical Constants of Solids*, edited by E. Palik.] The graph shows the p-polarization reflectivity 42, s-polarization reflectivity 44, and average reflectivity 46, with the average reflectivity 46 generally illustrating the overall reflectivity of the metal for the purpose of LEDs where light is generated with random polarization. The reflectivity at 0 degrees is lower than the reflectivity at 90 degrees, and this difference can result in up to 5% or more of the light being lost on each reflection. In an LED chip, in some instances TIR light can reflect off the mirror several times before it escapes and, as a result, small changes in the mirror absorption can lead to significant changes in the brightness of the LED. The cumulative effect of the mirror absorption on each reflection can reduce the light intensity such that less than 75% of light from the LED's active region actually escapes as LED light.

SUMMARY OF THE INVENTION

The present invention discloses one or more reflectivity layers for use in LEDs and LED chips to increase emission efficiency. One embodiment of a LED chip according to the present invention comprises an active LED structure having an active layer between two oppositely doped layers, and the active layer emitting light in response to an electrical signal applied to the oppositely doped layer. A first reflective layer is adjacent to one of the oppositely doped layers, and has an index of refraction different than the active LED structure, with the first reflective layer reflecting at least some active layer light. A second reflective layer is included on the first reflective layer, with the second reflective layer reflecting light not reflected by the first reflective layer.

Another embodiment of an LED chip according to the present invention comprises an active LED structure having an active layer between a p-type layer and an n-type layer, and the active layer emitting light in response to an electrical signal applied to the p-type and n-type layers. A current spreading layer is included on the p-type layer and a dielectric first reflective layer is included on the current spreading layer. The first reflective layer is arranged to reflect at least some active layer light. A metal layer is included on the first reflective layer, with the metal layer reflecting light not reflected by the first reflective layer.

Still another embodiment of an LED chip according to the present invention comprising an active LED structure emitting light in response to an electrical signal and a first reflective layer on the active LED structure. A second reflective layer on the first reflective layer both positioned to reflect LED structure light so that it contributes to use LED chip emission. Vias can be included through the first reflective layer to conduct an electrical signal through the first reflective layer to the active LED structure.

These and other aspects and advantages of the invention will become apparent from the following detailed description and the accompanying drawings, which illustrate by way of example the features of the invention.

DETAILED DESCRIPTION OF THE INVENTION

Figure 1:
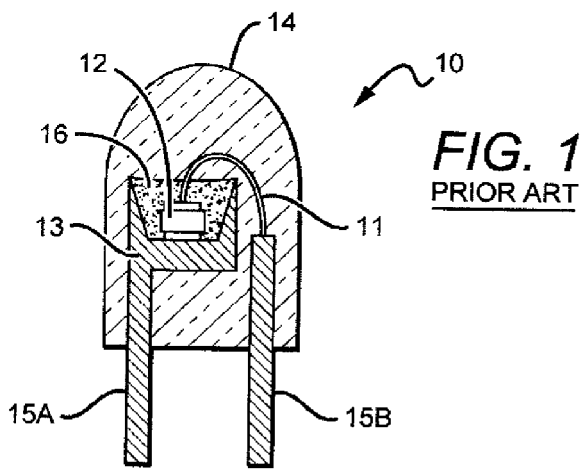
FIG. 1 is a sectional view of one embodiment of a prior art LED lamp.
Figure 2:
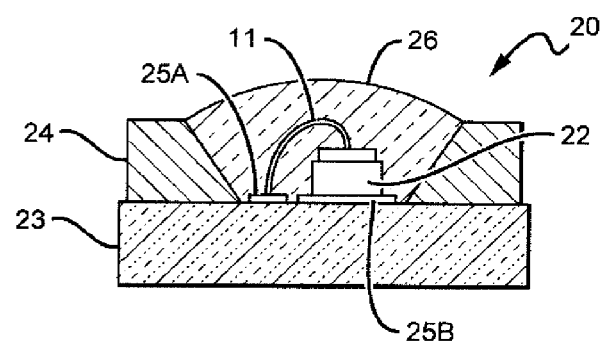
FIG. 2 is a sectional view of another embodiment of a prior art LED lamp.
Figure 3:
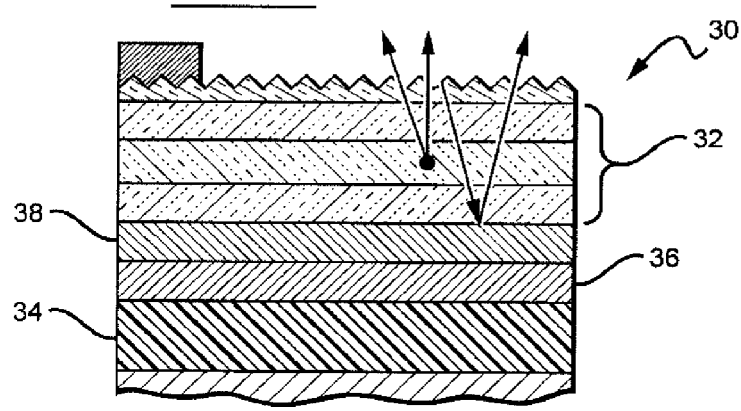
FIG. 3 is a sectional view of another embodiment of a prior art LED chip.
Figure 4:
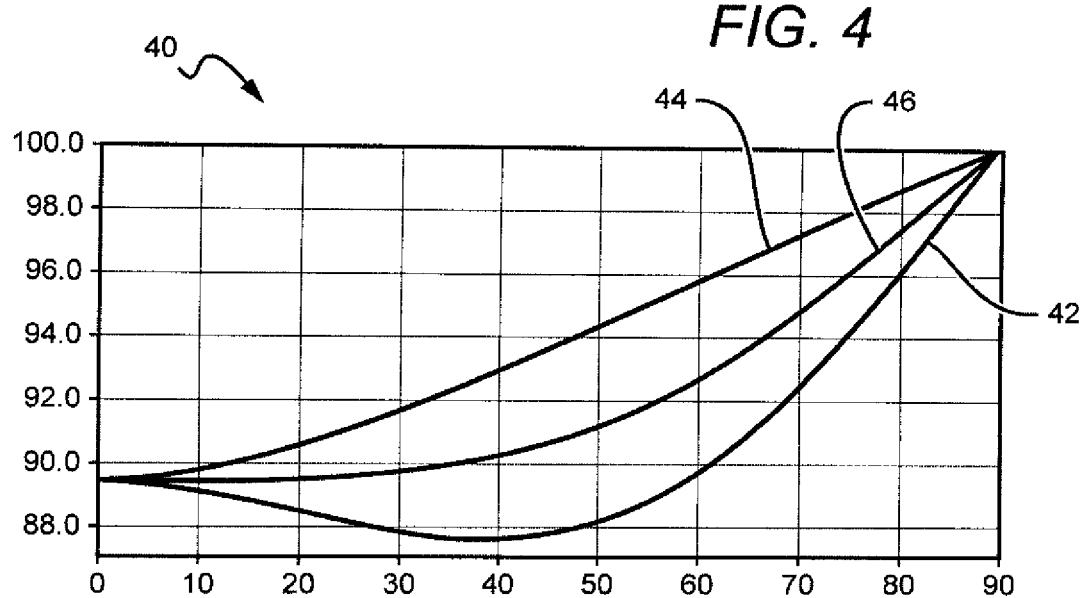
FIG. 4 is a graph showing the reflectivity of a metal reflector at different viewing angles.

The present invention is directed to solid-state emitters having internal or integral reflective surfaces/layers arranged to increase the emission efficiency of the emitters. The present invention is described herein with reference to light emitting diodes (LED or LEDs) but it is understood that it is equally applicable to other solid-state emitters. The present invention can be used as a reflector in conjunction with one or more contacts, or can be used as a reflector separate from the contacts.

As described above, different embodiments of light emitting diode (LED) chips according to the present invention comprises an active LED structure having an active layer between two oppositely doped layers. A first reflective layer can be provided adjacent to a one of the oppositely doped, layers, with the first layer comprising a material with a different index of refraction than the active LED structure. In most embodiments, the first layer can comprise a layer with an IR that is primarily lower at or near its in interface with the active LED structure. Stated differently, when the layer comprises a number of materials, some embodiments of the layer can have an average IR lower than the active LED structure. In still other embodiments, the portion of the reflective layer closest to the active LED structure should be less than the active LED structure, with some embodiments of this closer layer being approximately 2 to 4 angstroms (Å) thick.

The difference in IR between the active LED structure and the first reflective layer increases the amount of TIR light at the junction. In the embodiments where the first reflective layer has an IR lower than the active LED structure, the lower IR material provides a step down in IR that increases the amount of light that can experience TIR. Some embodiments of LED chips according to the present invention can also comprise a second reflective layer or metal layer that can be on and used in conjunction with the first reflective layer such that light passing through the first reflective layer (e.g. not experiencing TIR) can be reflected by the second reflective layer.

These internal or integral reflective layers can reduce optical emission losses that can occur by light being emitted in an undesirable direction where it can be absorbed. Light that is emitted from the emitter's active LED structure in a direction away from useful light emission, such as toward the substrate, submount, or metal reflector can be reflected by the first reflective layer. The reflective surfaces can be positioned to reflect this light so that it emits from the LED chip in a desirable direction. Embodiments of the present invention provide one or a plurality of layers and materials that can cooperate to efficiently reflect light in the desired directions so that it can contribute to the emitter's useful emission.

The first reflective layer can comprise many different materials, with some embodiments comprising a dielectric material such as $SiO_2$. It is understood that many other materials can be used with refractive indexes that are lower or higher, with the preferred having an IR that up to approximately 50% smaller than the LED's active structure material. In other embodiments the IR of the first reflective material can be up to approximately 40% smaller than the active structure material, while in other embodiments it can be up to approximately 30% smaller. For example in some embodiments GaN material of the active structure has an IR of 2.4 and the $SiO_2$ material of the reflective layer has and IR of 1.46. This represents a difference in IR between the two of approximately 39%.

Many conventional LEDs can rely primarily on a metal reflector layer made of different material such as Ag or Au. As described above, there can be losses with each reflection off metal reflectors, and these losses can be significant particularly for light making multiple passes and reflections in the LED. There are no optical losses in light reflected by TIR, so that when more light is reflected using TIR instead of a metal material, the emission efficiency of the LED can increase. Other conventional LEDs chips have relied on internal multiple layer reflectors, such as distributed Bragg reflectors (DBRs), but these reflectors can involve complex and costly manufacturing processes. Utilizing a reflective layer that comprises a single dielectric layer can reduce the overall manufacturing cost and complexity.

Different embodiments of emitters according to the present invention can also utilize other structures, layers or features that allow for efficient and reliable LED operation. In some embodiments, a current spreading layer can be included in proximity to the reflective layer to provide for spreading of current into the one or more layers of the active LED structure. In other embodiments, materials can be included to provide for reliable adhesion between different layers, such as between the low IR layer and the metal reflective layer. Different embodiments of the invention also provide having conductive via or path arrangements that provide conductive paths through the low IR reflective layer. This allows an electric signal to pass through the low IR layer along the vias so that the composite layer can be used as an internal layer, where an electrical signal can pass through the low IR layer during operation. This via arrangement can take many different shapes and sizes as described in detail below.

The present invention is described herein with reference to certain embodiments but it is understood that the invention can be embodied in many different forms and should not be construed as limited to the embodiments set forth herein. In particular, the lower IR first reflective layer can comprise many different material layers and can have many different thicknesses beyond those described herein. The first reflective layer is described herein as a layer of one material, such as a particular dielectric, but it is understood that it can comprise many different materials, and in some embodiments more than one layer. In these multiple layer embodiments, the IR for all the layers can be similar, and in some embodiments less than the IR for the active LED structure. Some embodiments, can have layers having layers or materials with a IR higher than the active LED structure, but these layers can be thin enough to have minimal optical impact. It is understood, that in some embodiments the number of layers in the first reflective layers would typically be less than the number of layers found in reflectors such as DBRs, and in some embodiments the layers would have substantially similar IRs. The first reflective layer can also be in many different locations on different solid-state emitters beyond those described herein, and can be used on different devices beyond solid state emitters. Further, the first reflective layer can be provided with or without conductive structures to allow electrical signals to pass through. It is understood that LEDs according to the present invention can also utilize single layer first reflective layer in conjunction with other reflectors such as metal reflective layers or DBR layers. The first reflective layer is arranged to maximize the amount of light reflected by TIR, while at the same time maintaining a simple, efficient and cost effective reflecting system.

It is also understood that when an element such as a layer, region or substrate is referred to as being "on", "adjacent" or "in proximity" to another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 5:
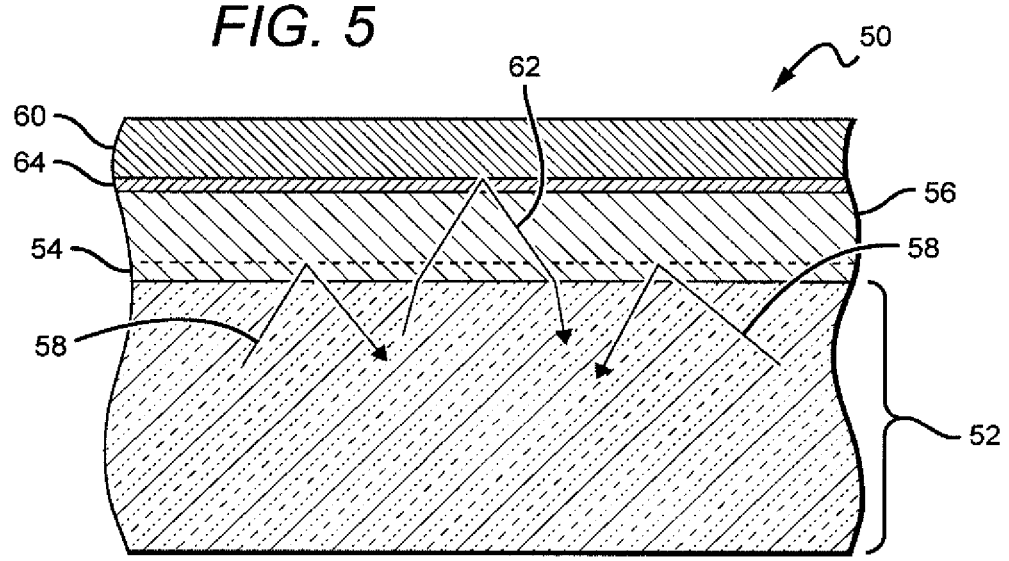
FIG. 5 is a sectional view of one embodiment of an LED chip according to the present invention.

FIG. 5 shows one embodiment of an LED chip 50 according to the present invention having reflective structures that allow for LED chip operation with increased emission efficiency. Although the present invention is described with reference to fabrication of a single LED chip it is understood that the present invention can also be applied to wafer level LED fabrication, fabrication of groups of LEDs, or fabrication of packaged LED chips. The wafer or groups of LEDs can then be separated into individual LED chips using known singulation or dicing methods. The present invention can also be used in different LEDs having different geometries, such lateral geometry or vertical geometry. The present invention can also be used in LEDs compatible with flip-chip mounting as well as those that are arranged for non flip-chip mounting.

The LED chip 50 comprises an LED active region or structure 52 that can have many different semiconductor layers arranged in different ways. The fabrication and operation of LEDs and their active structure are generally known in the art and only briefly discussed herein. The layers of the active structure 52 can be fabricated using known processes with a suitable process being fabrication using MOCVD. The layers of the active structure 52 can comprise many different layers and generally comprise an active layer sandwiched between n-type and p-type oppositely doped epitaxial layers, all of which are formed successively on a growth substrate. It is understood that additional layers and elements can also be included in the active structure 52, including but not limited to buffer, nucleation, contact and current spreading layers as well as light extraction layers and elements. The active layer can comprise single quantum well (SQW), multiple quantum well (MQW), double heterostructure or super lattice structures.

The active structure 52 can be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In one embodiment, the n- and p-type layers are gallium nitride (GaN) and the active layer comprises InGaN. In alternative embodiments the n- and p-type layers may be AlGaN, aluminum gallium arsenide (AlGaAs) or aluminum gallium indium arsenide phosphide (AlGaInAsP) and related compounds.

The growth substrate can be made of many materials such as sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III-nitrides than sapphire and results in Group III-nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in U.S. Pat. Nos. Re. 34,861; 4,946,547; and 5,200,022.

Different embodiments of the active structure can emit different wavelengths of light depending on the composition of the active layer and n- and p-type layers. In some embodiments, the active structure emits a blue light in the wavelength range of approximately 450 to 460 nm. The LED chip 50 can also be covered with one or more conversion materials, such as phosphors, such that at least some of the light from the LED passes through the one or more phosphors and is converted to one or more different wavelengths of light. In one embodiment, the LED chip emits a white light combination of light from the LED's active structure and light from the one or more phosphors.

As mentioned above, different layers can be included to allow for efficient operation of the LED chip 50. For some semiconductor materials, such as some Group-III nitride material systems, current does not effectively spread through the p-type layer. In these embodiments, a current spreading layer 54 can be on the active structure 52 in a location to aid in current spreading into the p-type layer. In some embodiments the current spreading layer 54 can cover some or the entire p-type layer and in some embodiments the current spreading layer 54 helps spread current from a p-type contact across the surface of the p-type layer as described in more detail below. This helps to provide improved current spreading across the p-type layer with a corresponding improvement in current injection from the p-type layer.

The current spreading layer 54 can comprise many different materials and is typically a transparent conductive oxide such as indium tin oxide (ITO) or a metal such as platinum (Pt), although other materials can also be used. The current spreading layer can have many different thicknesses, with the present invention having a thickness small enough to minimize absorption of light from the active structure that passes through the current spreading layer. Some embodiment of current spreading layer 54 comprising ITO, can have thicknesses less than 1000 angstroms (Å), while other embodiments can have a thickness less than 700 Å. Still other embodiments can have a thickness less than 500 Å. Still other embodiments can have a thickness in the range of 50 to 300 Å, with some of these embodiments having current spreading layer with a thickness of approximately 200 Å. The current spreading layer 54 as well as the reflective layers described below can be deposited using known methods. It is understood that in embodiments where current spreading is not a concern, the LED chips can be provided without a current spreading layer.

The LED chip 50 can also comprise a reflective layer 56 that can be formed on the active structure 52, and in the embodiment shown is formed on the current spreading layer 54 with current spreading layer between the reflectivity layer 56 and active structure 52. The reflective layer 56 can comprise many different materials and preferably comprises a material that presents an IR step between the material comprising the active structure 52. Stated differently, the reflective layer should have an IR that is smaller than the active structure to promote TIR of active structure light emitting toward the reflective layer 56, as shown by first light trace 58. Light that experiences TIR is reflected without experience absorption or loss, and TIR allows for the efficient reflection of active structure light so that it can contribute to useful or desired LED chip emission. In embodiments that rely on metal layers to reflect light, the light experiences loss with each reflection (as described above), which can reduce overall LED chip emission efficiency.

In some embodiments, the IR for the reflective layer 56 is lower than the IR for the active structure material, with lower IR material providing for increased TIR of active structure light. Many different materials can be used for the reflective layer 56, with some having an IR less than 2.3, while other embodiments can have an IR less than 2.15. In still other embodiments the IR can be less than 2.0. In some embodiments the reflective layer 56 can comprise a dielectric, with some embodiments comprising $SiO_2$. It is understood that other dielectric materials can be used such as SiN, Si, Ge, MgOx, MgNx, ZnO, SiNx, SiOx, AlN, and alloys or combinations thereof.

As mentioned above, some Group III nitride materials such as GaN can have an IR of approximately 2.4, and $SiO_2$ has an IR of approximately 1.46. Embodiments with an active LED structure 52 comprising GaN and that also comprises a $SiO_2$ reflective layer, can have a sufficient IR step between the two to allow for efficient TIR of light at the junction between the two as shown by light traces 58. The reflective layer 56 can have different thicknesses depending on the type of material, with some embodiments having a thickness of at least 0.2 microns (µm). In some of these embodiments it can have a thickness in the range of 0.2 to 0.7 µm, while in some of these embodiments it can be approximately 0.5 µm thick.

As light experiences TIR at the junction with the reflective layer 56 an evanescent wave with exponentially decaying intensity can extend into the reflective layer 56. This wave is most intense within approximately one third of the light wavelength from the junction (about 0.3 um for 450 nm light in SiO2). If the thickness of the reflective layer 56 is too thin, such that significant intensity remains in the evanescent wave at the interface between the first reflective layer 56 and the second reflective layer 60, a portion of the light can reach the second reflective layer 60. This in turn can reduce the TIR reflection at the first interface. For this reason, in some embodiments the reflective layer 56 should have a thickness of at least 0.3 um.

As mentioned above, the LED chips 50 according to the present invention can also utilize a second reflective layer, such as a metal layer 60, to reflect light that does not experience TIR at the junction with the reflective layer 56 and passes through the reflective layer 56. An example of the light reflected at the metal layer is shown by second light trace 62, which passes first through the reflective layer 56 before being reflected at the metal layer. The metal layer 60 can comprise many different materials such as Ag, Au, Al, or combinations thereof, with the present invention being Ag. Different embodiments according to the present invention can also comprise an adhesion layer 64 between the reflective layer 54 and the metal layer 60 to promote adhesion between the two. Many different materials can be used for the adhesion layer 64, such as TiO, TiON, $TiO_2$, TaO, TaON, $Ta_2O_5$, AlO or combinations thereof, with a preferred material being TiON. The adhesion layer can have many different thicknesses from just a few Å to thousands of Å. In some embodiments it can be less than 100 Å, while in other embodiments it can be less than 50 Å. In some of these embodiments it can be approximately 20 Å thick. The thickness of the adhesion layer 64 and the material used should minimize the absorption of light passing to minimize losses of light reflecting off the metal layer 60.

Figure 6:
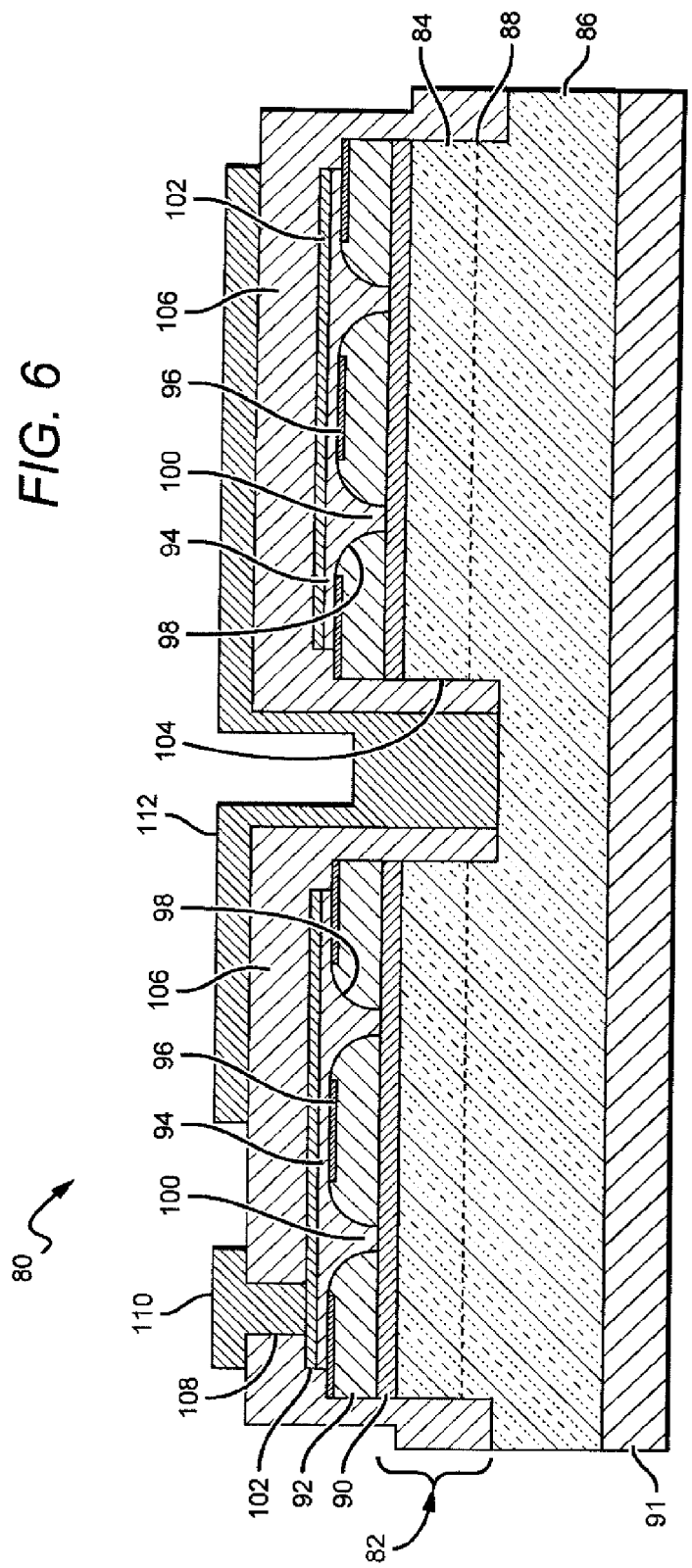
FIG. 6 is a sectional view of another embodiment of an LED chip according to the present invention.

It is understood that the reflective layer arrangements described above can be used in many different LED chips according to the present invention. FIG. 6 shows another embodiment of an LED chip 80 according to the present invention having a lateral geometry and arranged for flip-chip mounting. The LED chip 80 comprises a GaN active structure 82 having a p-type layer 84, n-type layer 86 and an active layer 88 formed on a substrate 91. The substrate 91 can comprise many different materials such as silicon carbide or sapphire, and can be shaped or textured to enhance light extraction such as the substrate shaping utilized in commercially available DA line of LEDs from Cree, Inc.

The LED chip 80 also comprises an current spreading layer 90 that is on the p-type layer 84. The current spreading layer 90 can have the same thickness and can comprise the same materials as the current spreading layer 54 shown in FIG. 5 and described above. In LED chip 80, the current spreading layer 90 can comprise ITO and is on the p-type layer 84 to spread current into the p-type layer. A low IR reflective layer 92 is arranged on the current spreading layer 90, and can have the same thickness and can comprise the same material as reflective layer 56 described above. In LED chip 80 the reflective layer can comprise $SiO_2$. A metal layer 94 and adhesion layer 96 are included on the reflective layer 92, with the adhesion layer 96 sandwiched between and providing adhesion between the metal layer 94 and reflective layer 92. These layers can comprise the same material and can have the same thickness as the metal layer 94 and adhesion layer 96 described above.

The LED chip 80 further comprises reflective layer holes 98 that can pass through the adhesion layer 96 and the reflective layer 92, to the current spreading layer 90. The holes 98 can then be filled when the metal layer 94 is deposited, the metal layer material can form vias 100 to the current spreading layer. As described in more detail below, the vias 100 provide a conductive path through the reflective layer, between the p-contact and the current spreading layer 90.

The holes 98 can be formed using many known processes such as conventional etching processes or mechanical processes such as microdrilling. The holes 98 can have many different shapes and sizes, with the holes 98 in the embodiment shown having angled or curved side surfaces and a circular cross-section with a diameter of less than 20 µm. In some embodiments, the holes can have a diameter of approximately 8 µm, with others having a diameter down to 1 µm. Adjacent holes 98 can be less than 100 µm apart, with the embodiment shown having a spacing of 30 µm spacing from edge to edge. In still other embodiments, the vias can have a spacing of as low as 10 µm or less. It is understood that the holes 98 (and resulting vias 100) can have cross-section with different shapes such as square, rectangular, oval, hexagon, pentagon, etc. In other embodiments the holes are not uniform size and shapes and there can be different or nonuniform spaces between adjacent holes.

In other embodiments different structures can be used to provide a conductive path between the p-contact and the current spreading layer. Instead of holes an interconnected grid can be formed through the reflective layer 92, with a conductive material then being deposited in the grid to form the conductive path through the composite layer. The grid can take many different forms, with portions of the grid interconnecting at different angles in different embodiments. An electrical signal applied to the grid can spread throughout and along the interconnected portions. It is further understood that in different embodiments a grid can be used in combination with holes, while other embodiments can provide other conductive paths. In some embodiments one or more conductive paths can run outside the LED chip's active layer such as along a side surface of the LED chip.

The LED chip 80 can also comprise a barrier layer 102 on the metal layer 94 to prevent migration of the metal layer material to other layers. Preventing this migration helps the LED chip 80 maintain efficient operation through its lifetime.

An active structure hole 104 can be included passing through the adhesion layer 96, reflective layer 92, and p-type layer 84, to expose the n-type layer 86. A passivation layer 106 is included on the barrier layer and the side surfaces of the active structure hole 104. The passivation layer protects and provides electrical insulation between the contacts and the layers below as described in more detail below. The passivation layer can comprise many different materials, such as a dielectric material.

Passivation layer hole 108 can be formed through the passivation layer 106 to the barrier layer 102 and/or the metal layer 94. A p-contact 110 can then be deposited in the passivation layer hole 108, with the p-contact 110 providing an electrical signal that can pass to the p-type layer 84. An electrical signal applied to the p-contact passes through the barrier layer 102, through the vias 100, and to the current spreading layer 90 through which it is spread to the p-type layer 84. Similarly, an n-contact is formed on the passivation layer and through the active structure hole 104, with the n-contact 112 providing an electrical path for an electrical signal to be applied to the n-type layer 86. A signal applied across the p-contact 110 and the n-contact 112 is conducted to the p-type layer 84 and the n-type layer 86, causing the LED chip to emit light from its active layer 88.

The p-contact 110 and the n-contact 112 can comprise many different materials such as Au, copper (Cu) nickel (Ni), indium (In), aluminum (Al), silver (Ag), tin (Sn), platinum (Pt) or combinations thereof. In still other embodiments they can comprise conducting oxides and transparent conducting oxides such as ITO, nickel oxide, zinc oxide, cadmium tin oxide, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, LaCuOS, $CuGaO_2$ and $SrCu_2O_2$. The choice of material used can depend on the location of the contacts as well as the desired electrical characteristics such as transparency, junction resistivity and sheet resistance.

As described above, the LED chip 80 is arranged for flip-chip mounting. In operation, the p-contact 110 and n-contact 112 are bonded to a surface, such as a printed circuit board (PCB), with electrical paths for applying an electrical signal to the LED chip 80. In most cases, the p-contact 110 and n-contact 112 are on the bottom surface, and light that is emitted toward the bottom of the LED chip risks being at least partially absorbed, such as by the PCB. The reflective layer 92 and metal layer 94 are arranged below the active layer 88 so that light emitted toward the bottom is reflected back up to contribute to useful LED chip emission. The reflective layer 92 reflects most light by TIR, with the majority of the remainder of the light being reflected by metal layer 94.

Figure 7:
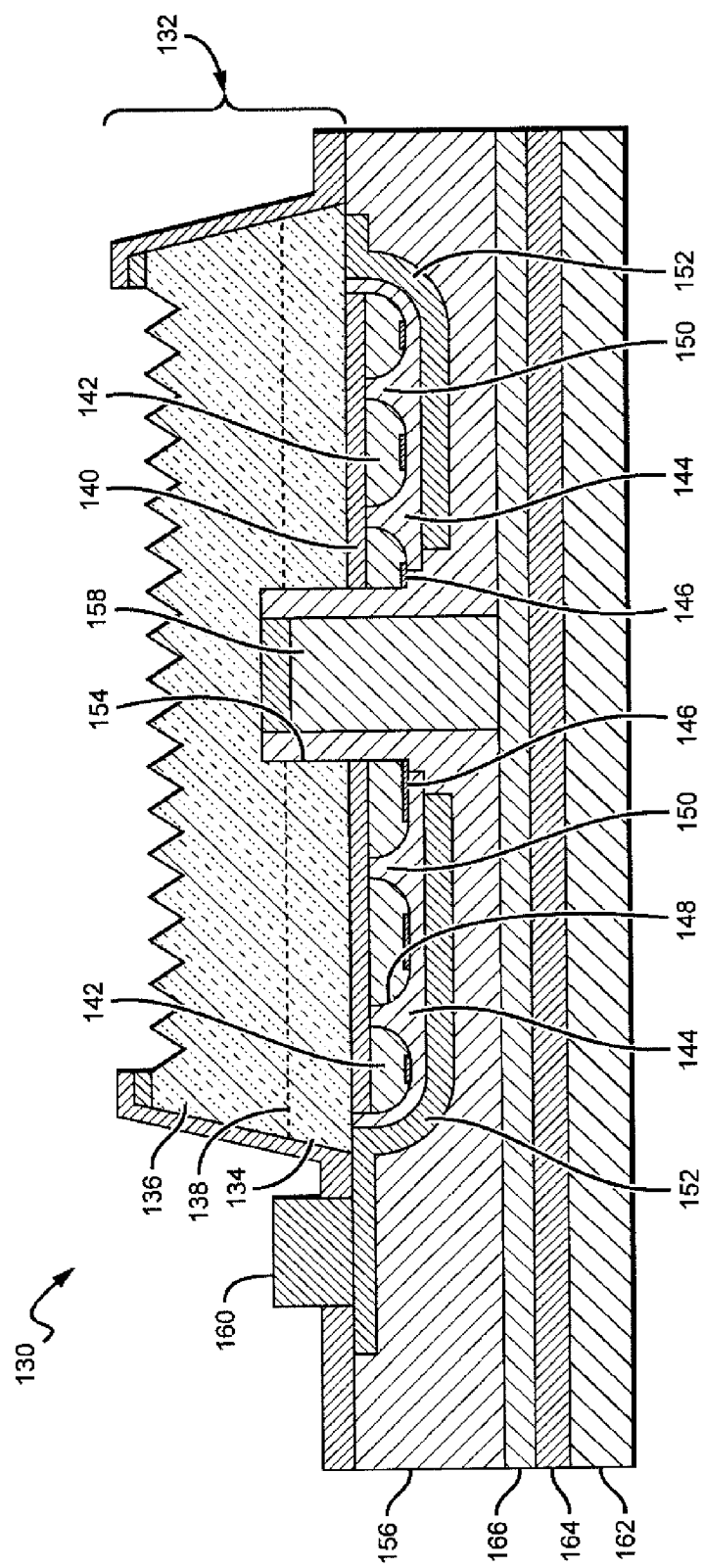
FIG. 7 is a sectional view of still another embodiment of an LED chip according to the present invention.

FIG. 7, shows another embodiment of a LED chip 130 according to the present invention that is flip-chip mounted onto a submount or substrate for use. The LED chip has many layers similar to those in the embodiment shown in FIG. 6 and described above including an active structure 132 comprising an p-type layer 134, n-type layer 136 and an active layer 138. A thin ITO current spreading layer 140 is included on the p-type layer 134 to spread current to the p-type layer 134 during operation. A reflective layer 142 is included on the current spreading layer as described above, with the $SiO_2$ reflective layer embodiments providing an IR step with the active structure 132 to promote TIR. A metal layer 144 is included on the reflective layer 142 with a TiON adhesion layer between the two.

Reflective layer holes 148 can be formed through the adhesion layer 146 and the reflective layer 142, with the metal layer 144 material forming vias 150 though the reflective layer 142. A barrier layer 152 is included on the metal layer 144 to prevent migration of metal layer materials as described above. An active structure hole 154 is included through the adhesion layer 146, reflective layer 142, current spreading layer 140 and the p-type layer 134. A passivation layer 156 is included on the barrier layer and the side surfaces of the active structure hole 154 and n-contact via or contact 158 is included in the active structure hole for applying an electrical signal to the n-type layer 136.

In this embodiment, the passivation layer 156 and the barrier layer 152 extend beyond the edge of the active structure 132 to form a mesa where a p-contact 160 can be formed on the barrier layer 152. An electrical signal applied to the p-contact 160 is conducted to the p-type layer through the barrier layer 152, reflective layer 142 and the current spreading layer 140. Accordingly, an electrical signal applied across the p-contact 160 and the n-contact/via 150 is conducted to the p-type layer 134 and n-type layer 136, causing the active layer 138 to emit light.

The growth substrate for LED chip 130 has been removed, and the top surface of the n-type layer is textured for light extraction. To provide mechanical stabilization, the LED chip 130 is flip-chip mounted to a silicon (Si) submount/substrate 162, with a bond metal layer 164 and blanket mirror 166 between the substrate 162 and the active structure 132. The blanket mirror 166 can be made of many different materials, with a suitable material being Al. The blanket mirror 166 helps to reflect LED light that escapes reflection by the reflective layer 142 and the metal layer 144, such as light that passes through the active structure hole 154.

The reflective layer 142 and the metal layer 144 are arranged between the LED chip's active structure 132 and the substrate 162 so that light emitted by the active structure 132 toward the substrate 162 can be reflected back to contribute to useful LED light emission. This reduces the amount of light that can be absorbed by structures such as the submount 162, with the embodiments according to present invention promoting reflection by TIR instead of reflection off metal layers, to further reduce light loss due to absorption.

It is understood that many different materials can be used in the different features in the embodiments according to the present invention, and that the features can be arranged in many different ways beyond the embodiments above. In some embodiments, the first reflective layer can comprise materials with lower indexes of refraction, such as air or other gasses. The fabrication of such devices can be somewhat more complex, but the resulting index of refraction for the reflective layer can be as low as approximately 1.

Although the present invention has been described in detail with reference to certain preferred configurations thereof, other versions are possible. Therefore, the spirit and scope of the invention should not be limited to the versions described above.

We claim:
1. A light emitting diode (LED) chip, comprising:
 an active LED structure comprising an active layer between two oppositely doped layers, and said active layer emitting light in response to an electrical signal applied to said oppositely doped layer;
 a first reflective layer adjacent one of said oppositely doped layers, and comprising an index of refraction different than said active LED structure, said first reflective layer reflecting at least some active layer light;
 a second reflective layer on said first reflective layer, said second reflective layer reflecting light not reflected by said first reflective layer;
 a barrier layer on said second reflective layer; and
 a passivation layer on a substantial portion of said barrier layer, wherein said passivation layer is electrically insulating.

2. The LED chip of claim 1, wherein said first reflective layer comprises a dielectric material.

3. The LED chip of claim 1, wherein said first reflective layer comprises $SiO_2$, SiN, Si, Ge, MgOx, MgNx, ZnO, SiNx, SiOx, AlN and alloys or combinations thereof.

4. The LED chip of claim 1, wherein said first reflective layer comprises $SiO_2$.

5. The LED chip of claim 1, wherein said second reflective layer comprises a metal.

6. The LED chip of claim 1, wherein said second reflective layer comprises Ag.

7. The LED chip of claim 1, further comprising a current spreading layer between said first reflective layer and said active LED structure.

8. The LED chip of claim 7, wherein said current spreading layer comprises ITO.

9. The LED chip of claim 7, wherein said current spreading layer comprises a thickness of less than 1000 Å.

10. The LED chip of claim 7, wherein said current spreading layer comprises a thickness in the range of 50 to 300 Å.

11. The LED chip of claim 1, further comprising an adhesion layer between said first reflective layer and said second reflective layer.

12. The LED chip of claim 1, wherein said first reflective layer comprises an index or refraction that is at least 50% different than the active LED structure's index of refraction.

13. The LED chip of claim 1, wherein said first reflective layer comprises an index of refraction that is lower than the active LED structure's index of refraction.

14. The LED chip of claim 1, wherein said barrier layer extends beyond said second reflective layer on at least one side.

15. The LED chip of claim 14, wherein a contact is on at least a portion of said barrier layer which extends beyond said second reflective layer.

16. The LED chip of claim 1, wherein said passivation layer is on a substantial portion of a top or bottom surface of said barrier layer.

17. The LED chip of claim 1, wherein said passivation layer is on a substantial portion of a top surface of said barrier layer.

18. A light emitting diode (LED) chip, comprising:
an active LED structure comprising an active layer between a p-type layer and an n-type layer, said active layer emitting light in response to an electrical signal applied to said p-type and n-type layers;
a current spreading layer on said p-type layer;
a dielectric first reflective layer on said current spreading layer, said dielectric first reflective layer reflecting at least some active layer light;
a metal layer on said dielectric first reflective layer, said metal layer reflecting light not reflected by said dielectric first reflective layer;
a barrier layer on said metal layer; and
a passivation layer on a substantial portion of a top or bottom surface of said barrier layer, wherein said passivation layer is electrically insulating.

19. The LED chip of claim 18, wherein said dielectric first reflective layer comprises an index of refraction different than said active LED structure.

20. The LED chip of claim 18, wherein said dielectric first reflective layer comprises an index of refraction less than said active LED structure.

21. The LED chip of claim 18, wherein said dielectric first reflective layer comprises an index of refraction up to 50% less than said active LED structure.

22. The LED chip of claim 18, wherein said dielectric first reflective layer comprises an index of refraction up to 40% less than said active LED structure.

23. The LED chip of claim 18, wherein said active LED structure comprises a Group-III nitride, and said dielectric first reflective layer comprises $SiO_2$.

24. The LED chip of claim 18, wherein said dielectric first reflective layer is at least 0.2 µm thick.

25. The LED chip of claim 18, wherein said metal layer comprises Ag.

26. The LED chip of claim 18, wherein said current spreading layer comprises ITO.

27. The LED chip of claim 18, further comprising an adhesion layer between said dielectric first reflective layer and said metal layer.

28. The LED chip of claim 18, wherein said metal layer extends beyond said reflective layer on at least one side.

29. The LED chip of claim 28, wherein a contact is on at least a portion of said barrier layer which extends beyond said metal layer.

30. The LED chip of claim 18, wherein said passivation layer is on a substantial portion of a top surface of said barrier layer.

31. A light emitting diode (LED) chip, comprising:
an active LED structure emitting light in response to an electrical signal;
a first reflective layer on said active LED structure;
a second reflective layer on said first reflective layer, both positioned to reflect LED structure light so that it contributes to use LED chip emission;
a barrier layer on said second reflective layer;
a passivation layer on a substantial portion of said barrier layer, wherein said passivation layer is electrically insulating; and
vias through said first reflective layer to conduct an electrical signal through said first reflective layer to said active LED structure.

32. The LED chip of claim 31, wherein said first reflective layer comprises an index of refraction less than said active LED structure.

33. The LED chip of claim 32, wherein said first reflective layer comprises an index of refraction that is up to 50% less than said active LED structure.

34. The LED chip of claim 31, further comprising a current spreading layer between said first reflective layer and said active LED structure.

35. The LED chip of claim 31, wherein said second reflective layer comprises a metal.

36. The LED chip of claim 31, further comprising an adhesion layer between said first reflective layer and said second reflective layer.

37. The LED chip of claim 31, wherein said barrier layer extends beyond said second reflective layer on at least one side.

38. The LED chip of claim 37, wherein a contact is on at least a portion of said barrier layer which extends beyond said second reflective layer.

39. The LED chip of claim 31, wherein said passivation layer is on a substantial portion of a top or bottom surface of said barrier layer.

40. The LED chip of claim 31, wherein said passivation layer is on a substantial portion of a top surface of said barrier layer.

* * * * *

UNITED STATES PATENT AND TRADEMARK OFFICE
CERTIFICATE OF CORRECTION

PATENT NO. : 9,461,201 B2  
APPLICATION NO. : 13/909927  
DATED : October 4, 2016  
INVENTOR(S) : Heikman and Ibbetson Page 1 of 1

It is certified that error appears in the above-identified patent and that said Letters Patent is hereby corrected as shown below:

In the Claims

At Column 14, Line 14 (Claim 28, Line 2), please change "said reflective layer" to -- said second reflective layer --.

Signed and Sealed this  
Twenty-fifth Day of April, 2017

Michelle K. Lee  
*Director of the United States Patent and Trademark Office*